(12) United States Patent
Seo et al.

(10) Patent No.: US 6,306,692 B1
(45) Date of Patent: Oct. 23, 2001

(54) COPLANAR TYPE POLYSILICON THIN FILM TRANSISTOR AND METHOD OF MANUFACTURING THE SAME

(75) Inventors: Seong Moh Seo, Inchon; Sung Ki Kim, Seoul, both of (KR)

(73) Assignee: LG. Philips Lcd., Co. LTD, Seoul (KR)

( * ) Notice: Subject to any disclaimer, the term of this patent is extended or adjusted under 35 U.S.C. 154(b) by 0 days.

(21) Appl. No.: 09/576,430

(22) Filed: May 22, 2000

(30) Foreign Application Priority Data

May 21, 1999 (KR) .................................................. 99-18388

(51) Int. Cl.[7] .......................... H01L 21/00; H01L 21/336; H01L 21/331; H01L 21/479
(52) U.S. Cl. ...................... 438/149; 438/150; 438/151; 438/152; 438/153; 438/154; 438/155; 438/156; 438/157; 438/158; 438/159; 438/160; 438/161; 438/162; 438/163; 438/165; 438/166; 438/292; 438/351; 438/466; 438/469; 438/470; 438/486
(58) Field of Search ..................................... 438/149–166, 438/486, 466, 469, 470, 292, 351

(56) References Cited

U.S. PATENT DOCUMENTS

| | | | |
|---|---|---|---|
| 4,398,343 | * 8/1983 | Yamazaki | 438/88 |
| 5,637,515 | * 6/1997 | Takemura | 438/162 |
| 5,923,962 | * 7/1999 | Ohtani et al. | 438/150 |
| 5,956,579 | * 9/1999 | Yamazaki et al. | 438/151 |
| 5,985,741 | * 11/1999 | Yamazaki et al. | 438/486 |
| 6,074,901 | * 6/2000 | Ohtani et al. | 438/166 |
| 6,124,154 | * 9/2000 | Miyasaka | 438/151 |
| 6,140,166 | * 10/2000 | Ohtani et al. | 438/166 |
| 6,165,876 | * 12/2000 | Yamazaki et al. | 438/517 |
| 6,171,890 | * 1/2001 | Adachi et al. | 438/162 |
| 6,194,255 | * 2/2001 | Hiroki et al. | 438/166 |

* cited by examiner

*Primary Examiner*—Matthew Smith
*Assistant Examiner*—Chuong A Luu
(74) *Attorney, Agent, or Firm*—Long Aldridge & norman LLP

(57) ABSTRACT

The present invention discloses a method of manufacturing a thin film transistor, including: depositing an amorphous silicon layer, an insulating layer, and a gate metal layer on a substrate sequentially; patterning the insulating layer and the gate metal layer to form a gate insulating layer and a gate electrode; treating an impurity and a catalyst metal on the amorphous silicon layer using the gate electrode as a mask; and applying a DC voltage to both terminals of the amorphous silicon layer to form a polysilicon layer, the polysilicon layer having source and drain regions and an active area.

11 Claims, 5 Drawing Sheets

COPLANAR TYPE POLYSILICON THIN FILM TRANSISTOR AND METHOD OF MANUFACTURING THE SAME

CROSS REFERENCE

This application claims the benefit of Korean Patent Application No. 1999-18388 filed on May 21, 1999, under 35 U.S.C. §119, the entirety of which is hereby incorporated by reference.

BACKGROUND OF THE INVENTION

1. Field of the Invention

The present invention relates to a thin film transistor (TFT), and more particularly, to a polysilicon thin film transistor (Poly-Si TFT) and a method of manufacturing the same.

2. Description of Related Art

In order to form a polycrystalline silicon layer as an active layer of the TFT, firstly an intrinsic amorphous silicon layer is first deposited using a plasma chemical vapor deposition (PCVD) technique or a low pressure chemical vapor deposition (LPCVD) technique so that an amorphous silicon layer is formed. Second, the amorphous silicon layer is crystallized through one or a combination of processes that may include a laser annealing technique, a solid phase crystallization (SPC) technique, and a metal induced crystallization (MIC) technique.

FIGS. 1A to 1D are cross-sectional views illustrating a known process of manufacturing a coplanar type polysilicon thin film transistor using a metal induced crystallization technique. As shown in FIG. 1A, a buffer layer 2 and an amorphous silicon layer 4 are deposited sequentially on a substrate 1. The buffer layer 2 serves to prevent the extraction of any alkali material from the substrate 1. A metal layer typically having a thickness of 30ÅA is deposited on the amorphous silicon layer 4 using a sputtering technique. Then, the amorphous silicon layer 4 is crystallized through a long duration heat treatment at a temperature of 500° C. to form a polysilicon layer 10.

A gate insulating layer 6 and a gate electrode 8 are formed sequentially on the polysilicon layer 10. The polysilicon layer 10 is patterned in the form of an island that has a width greater than that of both the gate insulating layer 6 and the gate electrode 8.

Susequently, as shown in FIG. 1B, an ion-doping process is carried out to define source and drain regions 12 and 14 using the gate electrode 8 as a mask. At this time, the electrical characteristics of the polysilicon layer 10 depend on a doped impurity gas that is either a p-type impurity gas such as $B_2H_6$ or an n-type impurity gas such as $PH_3$. The polysilicon layer portion 11 serves as an active area. After the ion-doping process, the activation process follows to activate the gas impurity-doped regions.

Next, as shown in FIG. 1C, an interlayer insulator 16 is formed over the whole substrate 1 covering the gate insulating layer 6 and the gate electrode 8. Interlayer insulator 16 is then etched to form contact holes 26 and 28, exposing the source and drain regions 12 and 14, respectively. Then, source and drain electrodes 18 and 20 are formed to contact the source and drain regions 12 and 14 respectively through the contact holes 26 and 28. In other words, source electrode 18 is formed to contact source region 12 through contact hole 26, and drain electrode 20 is formed to contact drain region 14 through contact hole 28. A passivation film 22 is formed over the entire substrate and etched to form a contact hole 30, exposing a portion of the drain electrode 20. A transparent conductive electrode is deposited and patterned into a pixel electrode 24 that contacts the exposed portion of the drain electrode 20 through contact hole 30, thereby completing fabrication of the most important components of the conventional coplanar type Poly-Si TFT.

In the conventional coplanar type Poly-Si TFT described above, however, the active area 11 that is substantially a channel region of the TFT contacts with the metal layer used during the crystallization process, thereby degrading the electrical characteristics of the Poly-Si TFT. Besides, since the activation process is an additional production step, the yield can be reduced.

To overcome the above problems, a metal induced lateral crystallization (MILC) technique has been introduced. FIG. 2 is a cross sectional view illustrating a lateral crystallization method. As shown in FIG. 2, the crystallization process of the amorphous silicon layer is not performed as in the FIG. 1A. Instead, an amorphous silicon layer 10' is patterned in the form of an island, and the gate insulating layer 6 and the gate electrode 8 are formed. Then, source and drain regions 12' and 14' are formed by an ion-doping process. A metal layer 3 is formed over the whole substrate 1 covering the gate electrode 8. Subsequently, the amorphous silicon layer 10' is crystallized by a long duration, high temperature treatment to form a polysilicon layer. At this point, crystal grains of the polysilicon layer grow from both end portions of the intrinsic amorphous silicon area 11' to a central portion at the same time that the source and drain regions 12' and 14' are crystallized. Accordingly, since the active area 11' under the gate insulating layer 6 does not contact the metal layer 3, electrical characteristics of the TFT is improved.

However, lateral crystallization of the intrinsic silicon layer requires a lengthy processing time, thereby causing a low yield. Production time is further lengthened by the additional processing step of activation.

SUMMARY OF THE INVENTION

An object of the present invention is to provide a coplanar type polysilicon thin film transistor having good electrical characteristics and a method of manufacturing the same permitting a short processing time.

In order to achieve the above object, the present invention provides a method of manufacturing a thin film transistor, including: sequentially depositing an amorphous silicon layer, an insulating layer, and a gate metal layer on a substrate; patterning the insulating layer and the gate metal layer to form a gate insulating layer and a gate electrode; treating the amorphous silicon layer with an impurity and a catalyst metal using the gate electrode as a mask; and applying a direct current (DC) voltage to both terminals of the amorphous silicon layer to form a polysilicon layer, the polysilicon layer having source and drain regions and an active area.

The step of treating the amorphous silicon layer with the catalyst metal can be performed after the step of treating the amorphous silicon layer with an impurity. If it is so desired, the step of treating the amorphous silicon layer with the catalyst metal can be performed before the step of treating the amorphous silicon layer with an impurity. Further, the step of treating the amorphous silicon layer with an impurity includes the step of exposing the amorphous silicon layer to a plasma containing a gas selected from a group consisting of $PH_3$ and $B_2H_6$. Alternatively, the step of treating the amorphous silicon layer with an impurity includes the step of ion-doping using a gas selected from a group consisting of $PH_3$ and $B_2H_6$. The catalyst metal comprises a material selected from a group consisting of Ni, Pb and Co. The gate insulating layer and the gate electrode are simultaneously patterned. The source and drain regions are spaced apart from the gate insulating layer.

The method of manufacturing a thin film transistor according to the preferred embodiment of the present invention further includes depositing an interlayer insulating layer on the whole substrate covering the gate electrode and the source and drain regions; patterning the interlayer insulating layer to form first and second contact holes; forming the source and drain electrodes contacting the source and drain regions respectively through the first and second contact holes; depositing a passivation film on the whole substrate covering the source and drain electrodes and patterning the passivation film to form a third contact hole; and forming a pixel electrode contacting with the drain electrode through the third contact hole. Further, a method of manufacturing a thin film transistor according to the preferred embodiment of the present invention further includes depositing an interlayer insulator on the whole substrate covering the gate electrode and the source and drain regions; patterning the interlayer insulator to form first, second and third contact holes; and forming simultaneously an auxiliary gate electrode, a source electrode, and a pixel electrode, contacting with the gate electrode and the source and drain regions respectively through the first, second and third contact holes.

The pixel electrode includes a drain electrode.

BRIEF DESCRIPTION OF THE DRAWINGS

For a more complete understanding of the present invention and the advantages thereof, reference is now made to the following descriptions taken in conjunction with the accompanying drawings, and in which.

DETAILED DESCRIPTION OF PREFERRED EMBODIMENTS

Reference will now be made in detail to the preferred embodiment of the present invention, example of which is illustrated in the accompanying drawings.

Figure 1A:
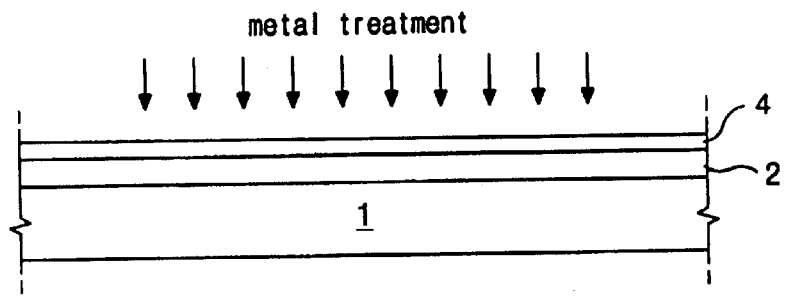
FIGS. 1A to 1D are cross sectional views illustrating a process of manufacturing a conventional coplanar type polysilicon thin film transistor.
Figure 1B:
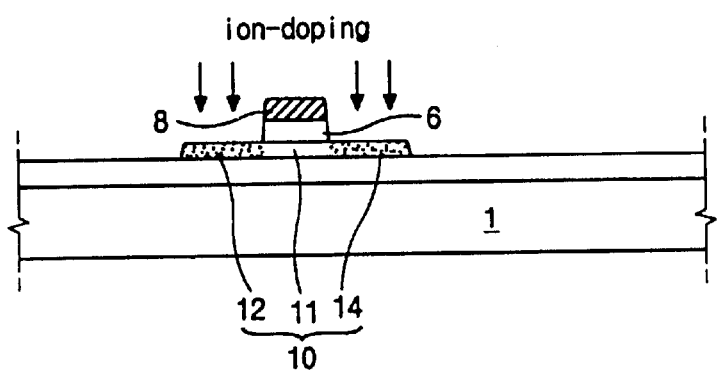
Figure 1C:
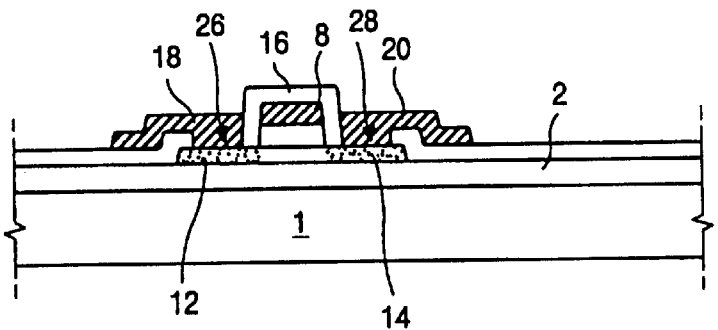
Figure 1D:
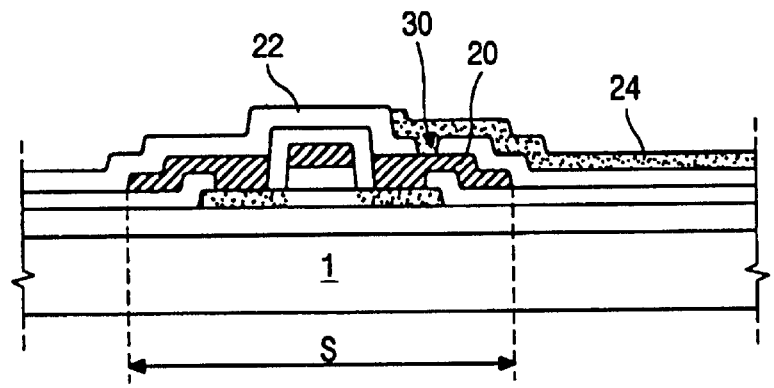
Figure 2:
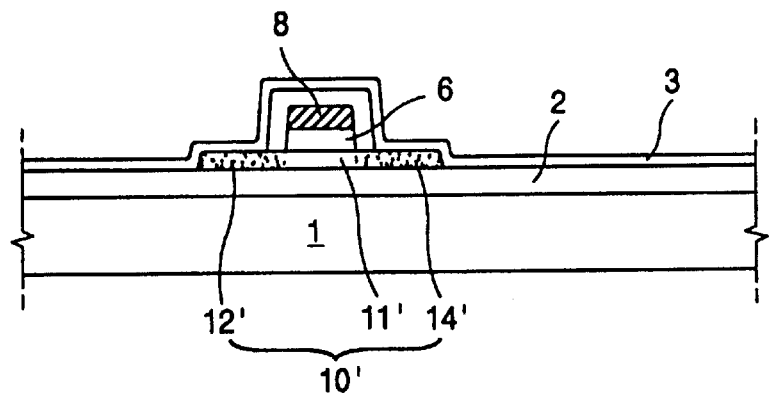
FIG. 2 is a cross sectional view illustrating a method of a metal induced lateral crystallization.
Figure 3A:
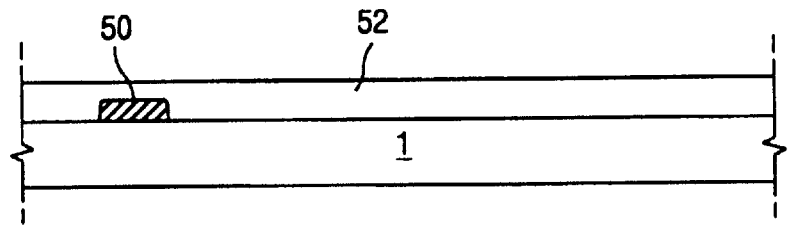
FIGS. 3A to 3F are cross sectional views illustrating a process of manufacturing a coplanar type polysilicon thin film transistor according to a first embodiment of the present invention.
Figure 3B:
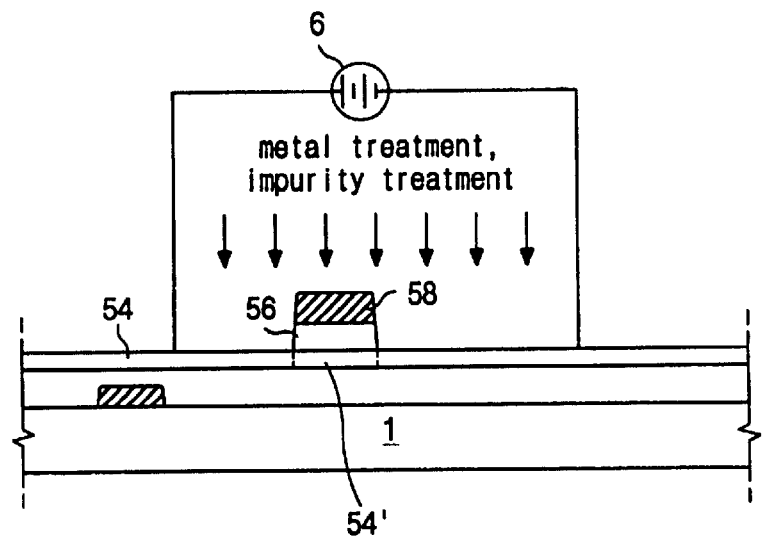

FIGS. 3A to 3F are cross sectional views illustrating a process of manufacturing a coplanar type polysilicon thin film transistor (Poly-Si TFT) according to a first embodiment of the present invention. As shown in FIG. 3A, a data line 50 is formed on a substrate 1, and a buffer layer 52 is formed on the exposed substrate 1 covering the data line 50. The data line for use in a coplanar type Poly-Si TFT of the first embodiment of the present invention is formed as a first step of the fabrication process, in order to simplify the manufacturing process and to avoid a complex structure. Conversely, generally a data line for use in a conventional coplanar type TFT is formed over an active area that is formed in later steps of the fabrication process. As shown in FIG. 3B, an amorphous silicon layer 54 is deposited on the buffer layer 52, and then a gate insulating layer 56 and a gate electrode 58 are simultaneously formed on the amorphous silicon layer 54. The gate insulating layer 56 is made of a material selected from a group consisting of SiNx, $SiO_2$ and tetra ethoxy silane (TEOS). Then, exposed portions of the amorphous silicon layer 54 are treated by either of an ion-doping and a plasma-treatment with an impurity containing an n-type impurity such as $PH_3$ or a p-type impurity such as $B_2H_6$. The ion-doping or plasma treatment is performed using the gate electrode 58 as a mask so as to enhance adhesion between the amorphous silicon layer 54 and a metal catalyst surface that will be formed in later process. Subsequently, a metal treatment is performed using a sputter, an evaporator or a metal solution to form the metal catalyst surface on the doped amorphous silicon layer 54. It is preferred that the metal catalyst surface is made of a material selected from a group consisting of Ni, Pb and Co. In this way, the metal treatment process can be performed after ion-doping process. As a result, since the metal catalyst surface does not contact an active area that will be formed in a later process such as in the MILC technique, the electrical characteristics of the Poly-Si TFT is improved.

Next, the crystallization process is performed using a field enhanced metal induced crystallization (FE-MIC) technique. The FE-MIC technique is one in which a DC high voltage 6 is applied to a metal treated film during crystallization, permitting a short crystallization time and a low crystallization temperature. Using the FE-MIC technique, the doped amorphous silicon layer 54 and the intrinsic amorphous silicon layer 54' are crystallized simultaneously. In this process, the intrinsic amorphous silicon layer 54' grows crystals in a lateral direction. Accordingly, the present invention does not require a separate activation process since the doped amorphous silicon layer 54 and the intrinsic amorphous silicon layer 54' are simultaneously crystallized. Therefore, the processing time is reduced.

Figure 3C:
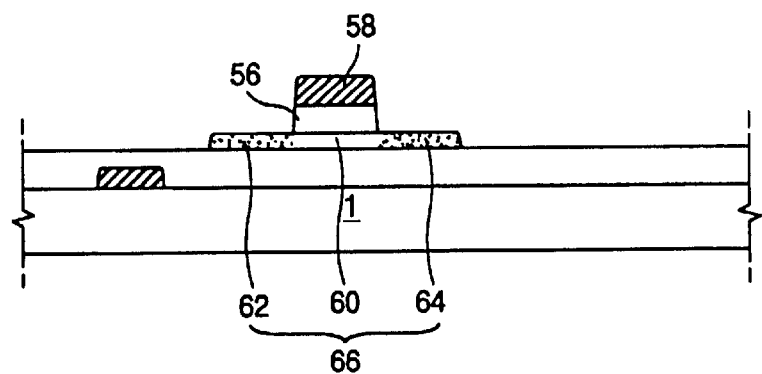

Sequentially, as shown in FIG. 3C, a polysilicon layer 66 produced by the crystallization process is patterned in the form of an island. The island-shaped polysilicon layer 66 has first and second polysilicon layer portions. The first polysilicon layer portion is referred to as source and drain regions 62 and 64, and the second polysilicon layer portion is referred to as the active area 60.

Figure 3D:
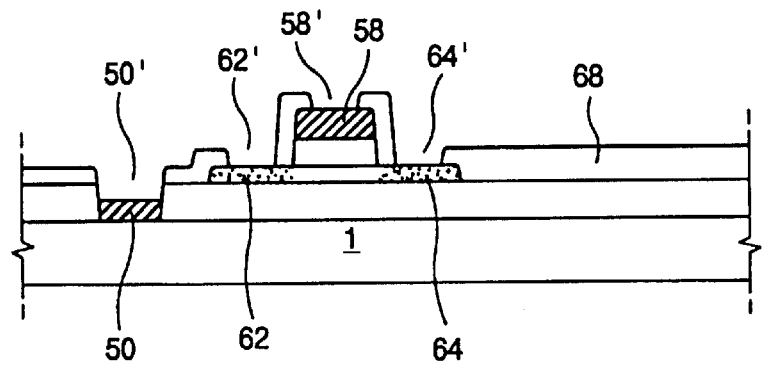
Figure 3E:
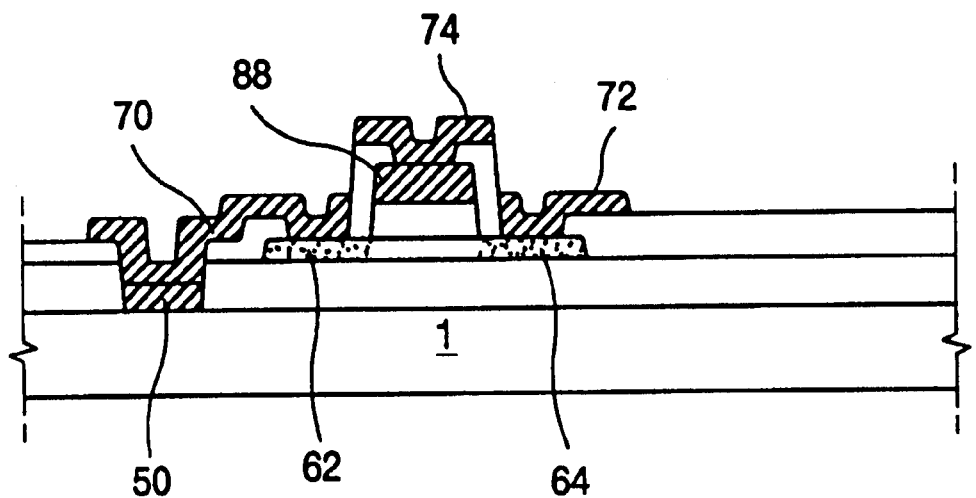

Referring to FIG. 3D, an interlayer insulator 68 is deposited over the whole substrate and etched to respectively form gate contact hole 58', source contact hole 62', and drain contact hole 64', located respectively on the gate electrode 58 and the source and drain regions 62 and 64. Then, as shown in FIG. 3E, three additional electrodes are formed: an auxiliary gate electrode 74 contacting the gate electrode 58 with a gate line (not shown); a source electrode 70 contacting the source region 62 and the data line 50; and a drain electrode 72 contacting the drain region 64.

Figure 3F:
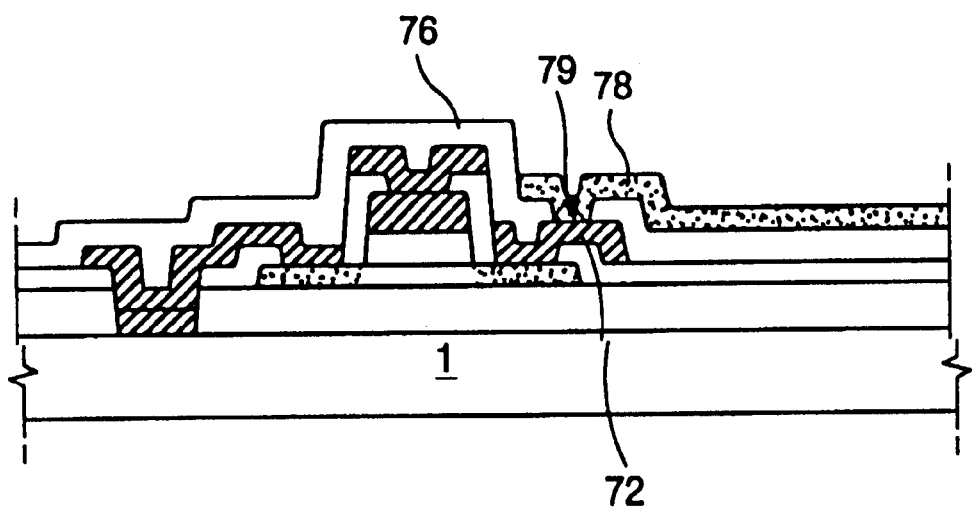

Sequentially, as shown in FIG. 3F, a passivation film 76 is deposited over the whole substrate 1 and etched to form a contact hole 79 on a portion of the drain electrode 72. Then, a pixel electrode is formed to contact the drain electrode 72 through the contact hole 79, thereby completing the Poly-Si TFT and the array panel for use in the LCD device.

As described herein before, using the FE-MIC technique according to the first embodiment of the present invention, the manufacturing processing time is short since the activation process can be omitted. Further, the Poly-Si TFT having good electrical characteristics can be obtained since the metal catalyst surface does not contact the active channel region directly during crystallization.

Figure 4A:
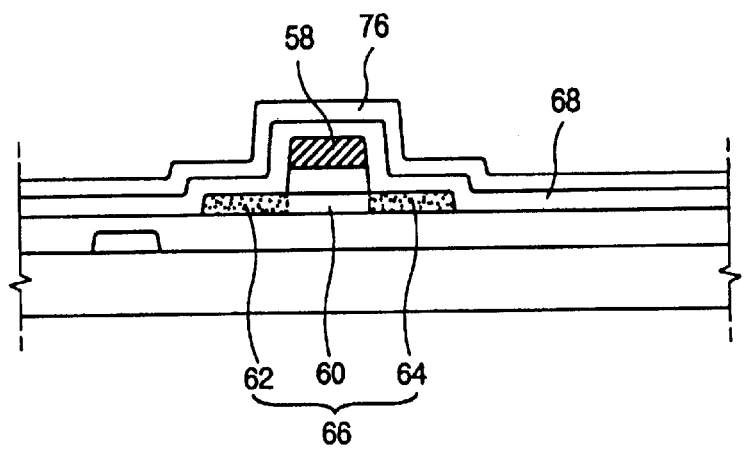
FIGS. 4A to 4C are cross sectional views illustrating a process of manufacturing a coplanar type polysilicon thin film transistor according to a second embodiment of the present invention.
Figure 4B:
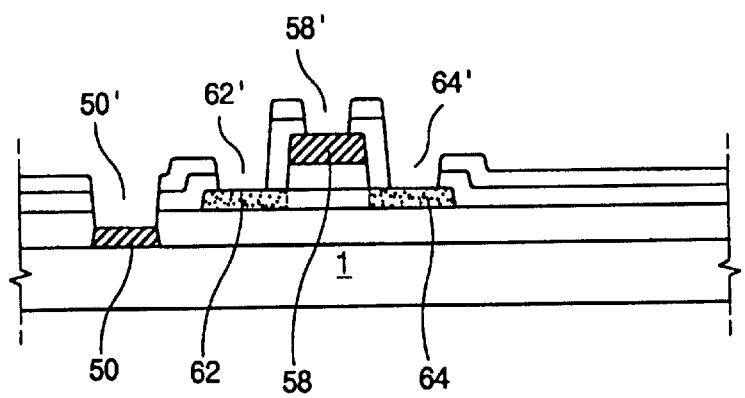
Figure 4C:
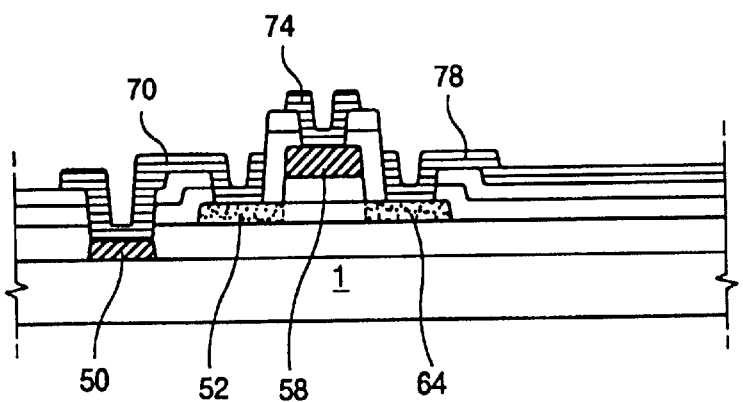

A second embodiment of the present invention relates to a method of forming a gate electrode, an auxiliary gate electrode, a source electrode and a drain electrode. FIGS. 4A to 4C show processes performed subsequent to the process shown in FIG. 3C. As shown in FIG. 4A, an interlayer insulator 68 is deposited over the whole surface of the substrate 1, and then a gate line (not shown) is formed.

Then, as shown in FIG. 4B, a passivation film 76 is deposited on the interlayer insulator 68. The interlayer insulator 68 and the passivation film 76 are simultaneously etched to form a data line contact hole 50', a source contact hole 62', a drain contact hole 64', a gate contact hole 58', and a gate line contact hole (not shown) on each corresponding location. Then, as shown in FIG. 4C, a transparent conductive material is deposited and patterned to form several electrodes: a pixel electrode 78 contacting a drain region 64; an auxiliary gate electrode 74 contacting the gate line and the gate electrode 58; a source electrode 70 contacting the date line 50 and the source region 52. In this embodiment, the pixel electrode 78 further serves as the drain electrode.

As described above according to the second preferred embodiment of the present invention, the process for manufacturing the Poly-Silicon TFT is simplified, since the source electrode 70, the auxiliary gate electrode 74 and the drain electrode 78 are formed at the same time as the pixel electrode.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a thin film transistor, comprising:
   depositing sequentially on a substrate an amorphous silicon layer, a first insulating layer, and a metal layer;
   patterning the first insulating layer and the metal layer to form a gate insulating layer and a gate electrode;
   treating the amorphous silicon layer with an impurity and a catalyst metal using the gate electrode as a mask; and
   applying a direct current voltage to both ends of the amorphous silicon layer to form a polysilicon layer, the polysilicon layer having source and drain regions and an active area.

2. The method of claim 1, wherein the step of treating the amorphous silicon layer with the catalyst metal is performed after the step of treating the amorphous silicon layer with an impurity.

3. The method of claim 1, wherein the step of treating the amorphous silicon layer with a catalyst metal is performed before the step of treating the amorphous silicon layer with an impurity.

4. The method of claim 1, wherein the step of treating the amorphous silicon layer with an impurity includes the step of exposing the amorphous silicon layer to a plasma containing a gas selected from a group consisting of $PH_3$ and $B_2H_6$.

5. The method of claim 1, wherein the step of treating the amorphous silicon layer with an impurity includes the step of ion-doping using a gas selected from a group consisting of $PH_3$ and $B_2H_6$.

6. The method of claim 1, wherein the catalyst metal comprises a material selected from a group consisting of Ni, Pb and Co.

7. The method of claim 1, wherein the gate insulating layer and the gate electrode are simultaneously patterned.

8. The method of claim 1, wherein the source and drain regions are spaced apart from the gate insulating layer.

9. The method of claim 1, further comprising,
   depositing a second insulating layer on the whole substrate covering the gate electrode and the source and drain regions;
   patterning the second insulating layer to form first and second contact holes;
   forming source and drain electrodes contacting the source and drain regions respectively through the first and second contact holes respectively;
   depositing a passivation film on the whole substrate covering the source and drain electrodes and patterning the passivation film to form a third contact hole; and
   forming a pixel electrode contacting the drain electrode through the third contact hole.

10. The method of claim 1, further comprising,
    depositing a second insulating layer on the whole substrate covering the gate electrode and the source and drain regions;
    patterning the second insulating layer to form first, second and third contact holes; and
    forming simultaneously an auxiliary gate electrode, a source electrode, and a pixel electrode contacting the gate electrode, source region and drain region respectively through the first, second and third contact holes respectively.

11. The method of claim 10, wherein the pixel electrode includes a drain electrode.

* * * * *